(12) United States Patent
Wang et al.

(10) Patent No.: US 9,106,230 B1
(45) Date of Patent: Aug. 11, 2015

(54) INPUT-OUTPUT CIRCUITRY FOR INTEGRATED CIRCUITS

(71) Applicant: Altera Corporation, San Jose, CA (US)

(72) Inventors: Bonnie I. Wang, Cupertino, CA (US); Warren Nordyke, Cupertino, CA (US); Weiqi Ding, Fremont, CA (US); Yan Chong, San Jose, CA (US)

(73) Assignee: Altera Corporation, San Jose, CA (US)

( * ) Notice: Subject to any disclaimer, the term of this patent is extended or adjusted under 35 U.S.C. 154(b) by 237 days.

(21) Appl. No.: 13/828,467

(22) Filed: Mar. 14, 2013

(51) Int. Cl.
*H03L 7/06* (2006.01)
*H03K 19/173* (2006.01)

(52) U.S. Cl.
CPC .................................. *H03K 19/1737* (2013.01)

(58) Field of Classification Search
None
See application file for complete search history.

(56) References Cited

U.S. PATENT DOCUMENTS

| | | | |
|---|---|---|---|
| 5,614,855 A * | 3/1997 | Lee et al. | 327/158 |
| 6,169,436 B1 * | 1/2001 | Marbot | 327/270 |
| 6,788,123 B2 * | 9/2004 | Roy | 327/261 |
| 6,897,693 B2 * | 5/2005 | Kim | 327/158 |
| 6,958,634 B2 * | 10/2005 | Rashid | 327/141 |
| 7,116,147 B2 * | 10/2006 | Kase | 327/158 |
| 7,487,378 B2 | 2/2009 | Morein et al. | |
| 7,509,515 B2 | 3/2009 | Macri et al. | |
| 7,715,514 B2 | 5/2010 | Takeuchi | |
| 7,808,295 B2 * | 10/2010 | Sakiyama et al. | 327/333 |
| 8,301,930 B2 | 10/2012 | Morein et al. | |
| 2008/0036514 A1 * | 2/2008 | Tai | 327/158 |

* cited by examiner

*Primary Examiner* — Crystal L Hammond
(74) *Attorney, Agent, or Firm* — Jason Tsai; Treyz Law Group

(57) ABSTRACT

An integrated such as a programmable integrated circuit may include input-output pins that have associated input-output circuits. An input-output circuit may include memory interface circuits, clock recovery interface circuits, shared interpolator circuitry, and selection circuitry that may be configured to convey control signals from selected interface circuits to the shared interpolator circuitry. The interpolator circuitry may receive multiple clock signals and perform phase interpolation operations on the clock signals based on the selected control signals to produce modified clock signals. The modified clock signals may be used by the selected interface circuits for communications over the input-output pins. Logic design computing equipment such as computing equipment having CAD tools may be used to configure the selection circuitry.

20 Claims, 13 Drawing Sheets

PHASE ADJUSTMENT TABLE

INPUT-OUTPUT CIRCUITRY FOR INTEGRATED CIRCUITS

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

Programmable integrated circuits include input-output circuitry that is used for communications with external circuits such as memory and network devices. Because programmable integrated circuits can be configured in many different ways and are installed on many different types of boards, it can be challenging to design input-output circuitry that accommodates multiple configurations of the programmable integrated circuits, especially with ever-increasing communications speeds and performance requirements. For example, conventional integrated circuits typically include dedicated input-output circuitry at each input-output pin for each possible communications function. Communications functions include high-speed functions such as external memory communications or high-speed network communications. However, input-output circuitry for high-speed functions can include complex clock circuitry such as large multiplexers and clock phase interpolators that occupy a disproportionate amount of valuable circuit area.

SUMMARY

An integrated circuit such as a programmable integrated circuit may include input-output pins that have corresponding input-output circuits. An input-output circuit may include first and second interface circuits that communicate using respective first and second protocols or standards. The first and second interface circuits may be external memory interface circuits or clock recovery interface circuits. The input-output circuit may include interpolator circuitry that is shared between the first and second interface circuits. The interpolator circuitry may include one or more phase interpolation circuits that receive multiple clock signals and perform phase interpolation operations on the clock signals to produce modified clock signals. A phase interpolation circuit may include first and second multiplexers that receive the clock signals and produce clock signals selected from the received clock signals. The selected clock signals may be provided to respective adjustable-strength driver circuits that drive an output terminal (path) of the interpolation circuit to produce a modified clock signal. The modified clock signal may be used by interface circuits during communications operations.

An input-output circuit may include selection circuitry such as multiplexing circuitry that receives clock control signals from the interface circuits of that input-output circuit. The selection circuitry may accommodate sharing of the interpolator circuitry between the interface circuits. The selection circuitry may be configured via programmable elements to provide control signals from a first portion of the interface circuits to the interpolator circuitry in a first mode and to provide control signals from a second portion of the interface circuits to the interpolator circuitry in a second mode. For example, in a memory interface mode, the selection circuitry may be configured to provide control signals from memory interface circuits to the interpolator circuitry.

As another example, in a clock recovery mode, the selection circuitry may be configured to provide control signals from clock recovery interface circuits to the interpolator circuitry.

Logic design computing equipment such as computing equipment having CAD tools may be used to configure input-output circuits having shared interpolator circuitry. The logic design computing equipment may select a mode of operation for the input-output circuit and identify which interface circuits of the input-output circuit are associated with the selected mode of operation. The logic design computing equipment may configure selection circuitry of the input-output circuit to convey control signals from the identified interface circuits to the shared interpolator circuitry.

Further features of the present invention, its nature and various advantages will be more apparent from the accompanying drawings and the following detailed description.

DETAILED DESCRIPTION

Embodiments of the present invention relate to integrated circuits containing input-output circuitry that is used to communicate with external circuitry. The integrated circuits may be digital signal processors, microprocessors, application specific integrated circuits, or other suitable integrated circuits. These types of integrated circuits that are operable to communicate with external circuitry can benefit from improved input-output circuitry.

Figure 1:
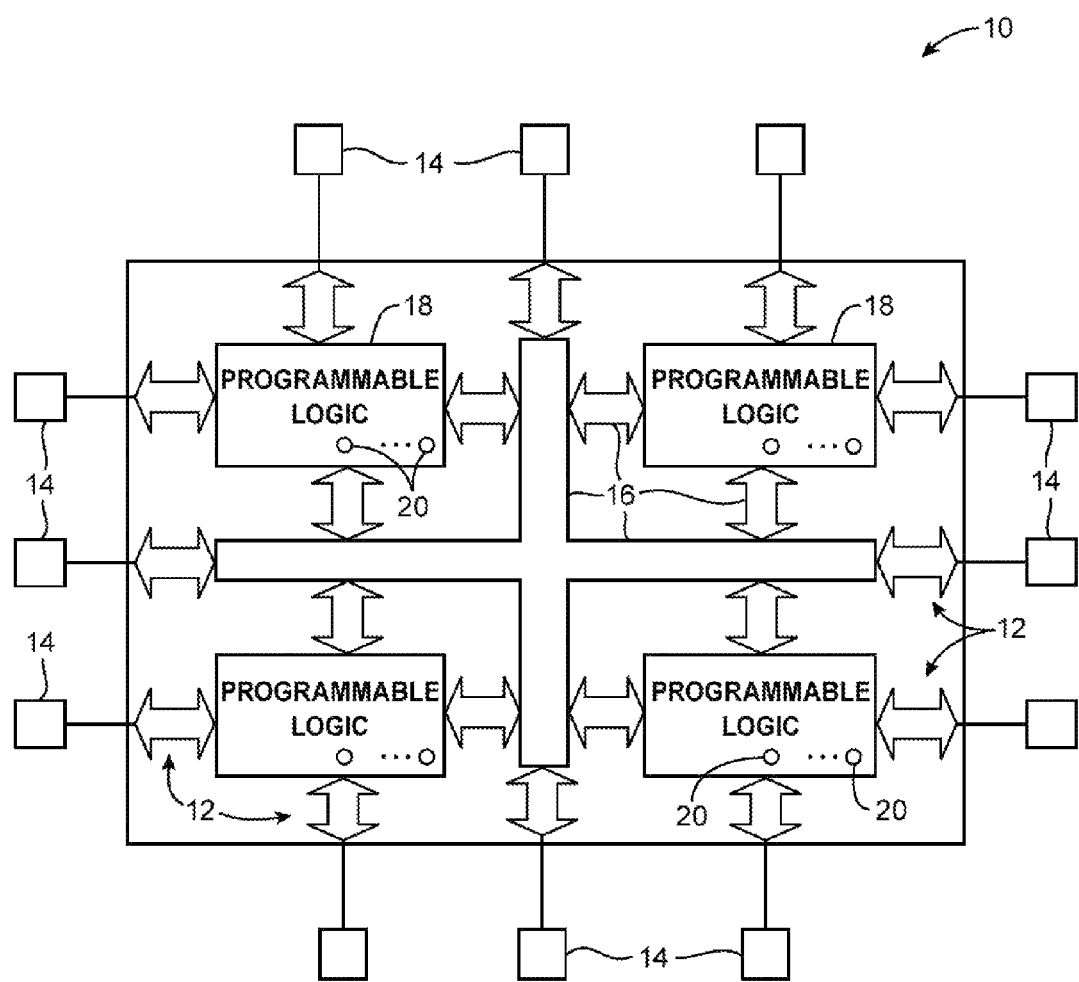
FIG. 1 is a diagram of an illustrative programmable integrated circuit having input/output circuits in accordance with an embodiment of the present invention.

As an example, an integrated circuit such as a programmable integrated circuit may include input-output circuitry. This is merely illustrative and does not serve to limit the scope of the present invention. If desired, application specific integrated circuits, microprocessors, and other application specific products may contain input-output circuitry. FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
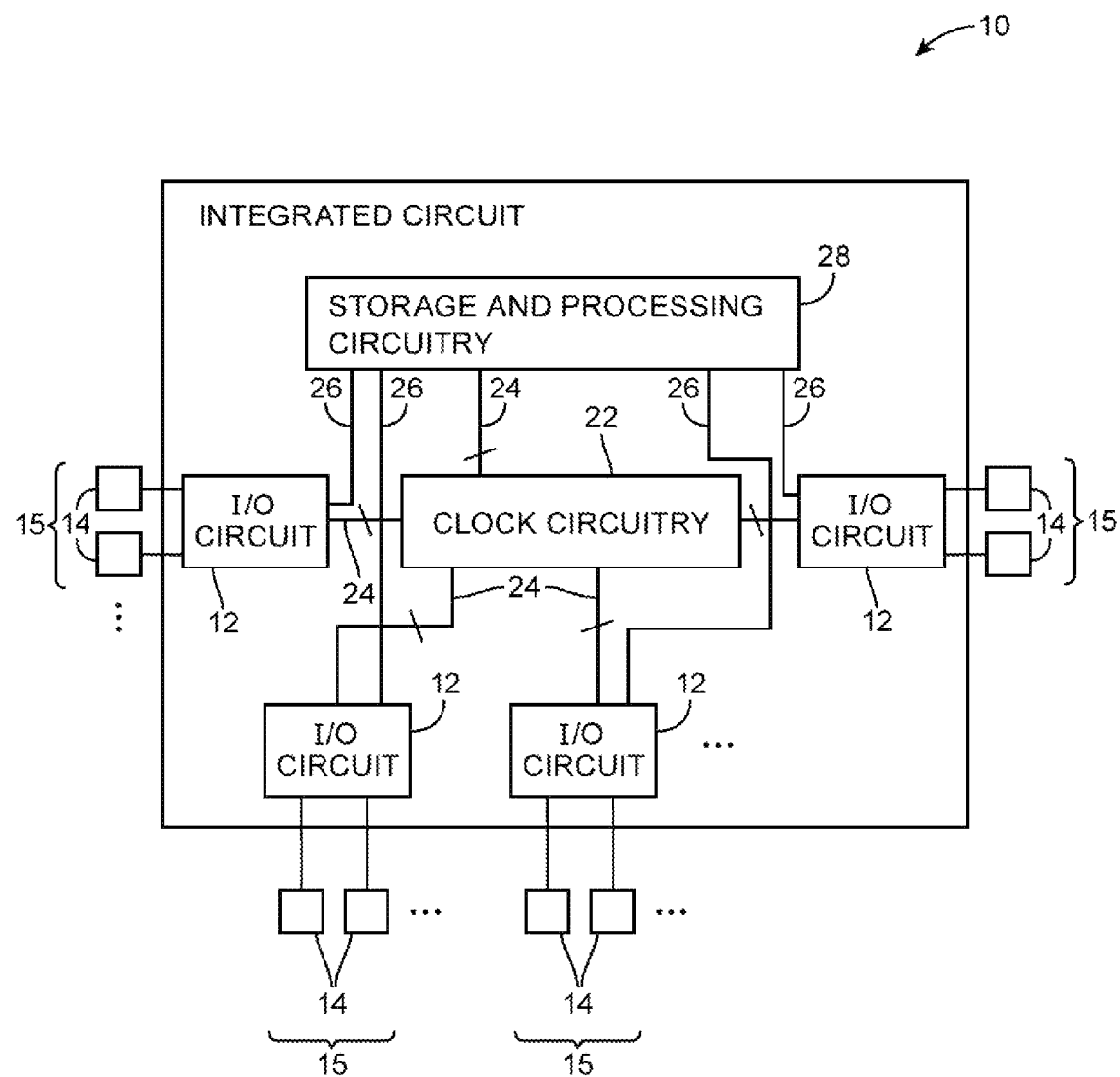
FIG. 2 is a diagram of an illustrative integrated circuit having input/output circuits that are coupled to clock circuitry in accordance with an embodiment of the present invention.

An integrated circuit may communicate with external circuitry such as memory circuits or other integrated circuits using input-output circuits 12. The input-output circuits may send and receive communications signals based on clock signals. FIG. 2 is an illustrative diagram of an integrated circuit 10 having clock circuitry 22 that generates clock signals for integrated circuit 10.

Clock circuitry 22 may include clock generation circuitry such as phase-locked loops (PLLs), delay-locked loops (DLL), resonant circuits, or other clock circuitry. Clock paths 24 may serve to convey the clock signals from clock circuitry 22 to other circuitry throughout integrated circuit 10. Clock paths 24 may be organized in any desired clock routing structure. For example, clock paths 24 may be implemented using balanced clock routing structures such as H-tree structures or may be implemented using unbalanced routing structures.

The example of FIG. 2 in which the clock signals are generated by clock circuitry is merely illustrative. If desired, clock signals may be generated using off-chip clock generation circuitry and provided to the integrated circuit via pins 14 and I/O circuits 12.

Storage and processing circuitry 28 may receive clock signals via clock paths 24. Circuitry 28 may be coupled to I/O circuits 12 by paths 26. Circuitry 28 may communicate with external (e.g., off-chip) circuits using I/O circuits 12 and input-output pins 14. Processing circuitry 28 may be formed from programmable circuitry such as programmable logic 18 of FIG. 1 that has been configured to implement desired functions. This example is merely illustrative. If desired, processing circuitry may include dedicated circuitry such as application-specific circuits that perform predetermined functions.

Paths 26 may formed from interconnects such as programmable interconnects 16 of FIG. 1 or dedicated interconnects. Input/output circuits 12 may interface between storage and processing circuitry 28 and external circuits that are coupled to input/output pins 14. Programmable logic that is coupled to a given I/O circuit 12 may be configured based on desired functionality. For example, programmable logic that is coupled to the I/O circuit may be configured as a memory controller that reads and writes data when the I/O circuit is coupled to external memory. As another example, the programmable logic may be configured as communications circuitry for data communications such as Ethernet communications.

Input/output circuits 12 may include interface circuitry that accommodates communications using different protocols and/or standards. Protocols and standards that may be implemented at an input/output circuit 12 may include network standards and protocols such as Ethernet, gigabit Ethernet such as the 10 Gigabit Attachment Unit Interface (XAUI), or other communications network standards or protocols. Memory standards such as double-data-rate (DDR) memory standards may be implemented at the input/output circuit. These examples are merely illustrative. If desired, any suitable interface and any number of desired interfaces for communicating with external circuitry may be implemented at each input/output circuit 12. Each input/output circuit 12 may be coupled to a corresponding set 15 of input/output pins 14. Sets 15 may each include one or more input/output pins 14.

Figure 3:
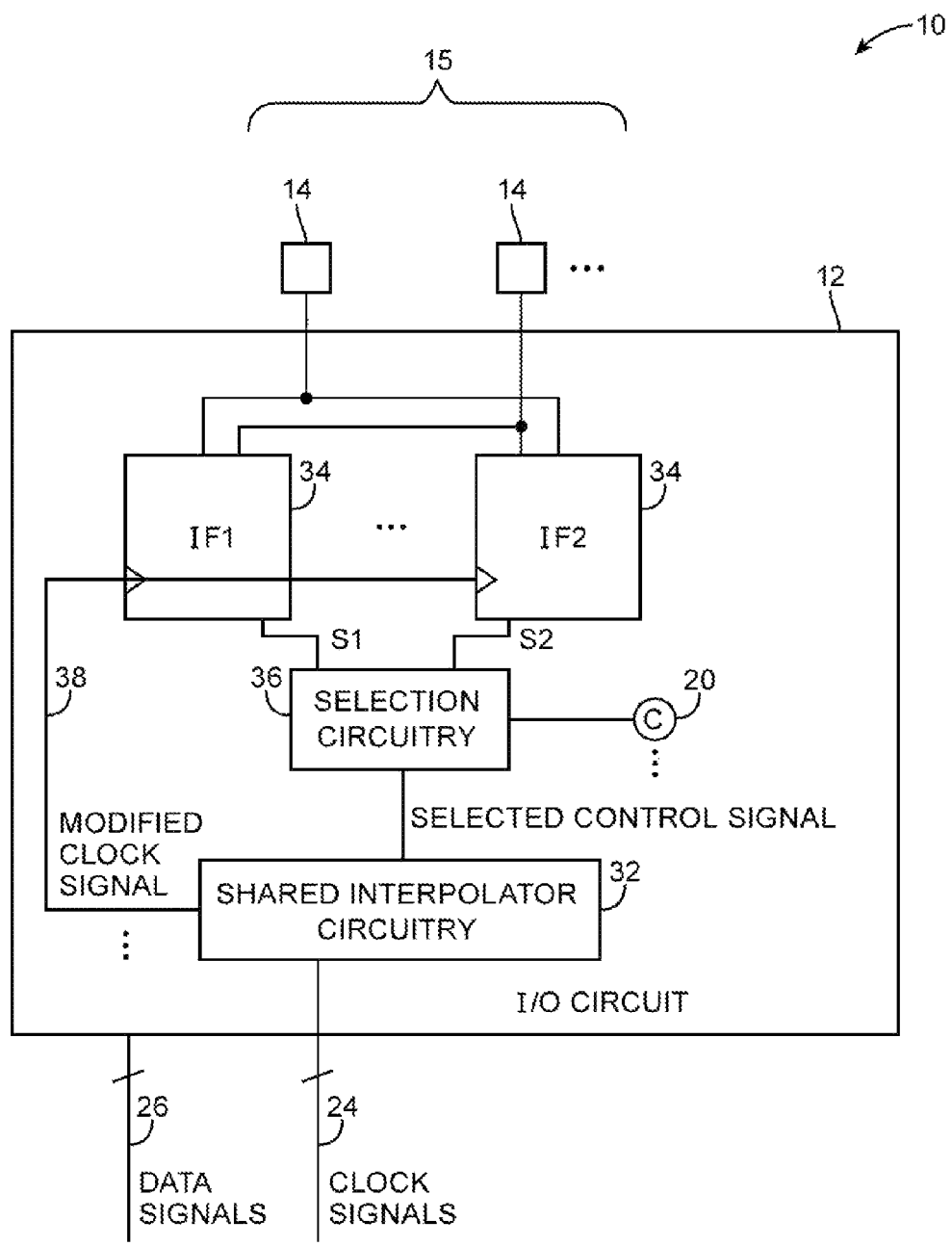
FIG. 3 is a diagram of an illustrative input/output circuit having interface circuits that share interpolator circuitry in accordance with an embodiment of the present invention.

It can be challenging to design input-output circuits that support multiple interface protocols and/or standards. For example, additional die area may be required to implement additional interfaces at input-output circuits. To conserve die area, multiple interfaces at an input-output circuit may be implemented having shared circuitry. FIG. 3 is an illustrative diagram of an input-output circuit 12 with interpolator circuitry 32 that is shared by interface circuits 34.

Interface circuits 34 may each correspond to a respective interface protocol or standard. Interface circuits 34 may convey data received via paths 26 (e.g., from storage and processing circuitry 28 of FIG. 2) to I/O pins 14 using the corresponding interface standards. Similarly, data received at I/O pins 14 may be processed by interface circuits 34 according to the appropriate interface standard and provided at paths 26. For example, interface circuit IF1 may serve as an Ethernet interface that accommodates communications between integrated circuit 10 and Ethernet networks that are coupled to input-output pins 14 of I/O circuit 12. As another example, interface circuit IF2 may serve as an external memory interface (EMIF) that accommodates memory operations such as read and write operations on an external memory circuit.

Interface circuits 34 are often used to implement high-speed interfaces such as 10 GBps Ethernet and DDR memory. Such high-speed interfaces operate based on clock signals operating at high frequencies such as 10 MHz, 125 MHz, 400 MHz, 800 MHz, or more. At such frequencies, fluctuations in clock phase due to factors such as noise and manufacturing variations can result in communications errors and potential interface failures. In some scenarios, incoming data and control signals received from an external circuit such as external network circuitry may be generated based on an off-chip clock signal that may have different characteristics from on-chip clock signals such as those generated by clock circuitry 22 of FIG. 2. For example, an externally generated clock signal may have a different phase from on-chip clock signals.

Interpolator circuitry 32 may be used to generate one or more clock signals for operating interface circuits 34 to match external circuitry that is coupled to I/O circuits 14. A modified clock signal may be generated from a set of clock signals received on clock paths 24 (e.g., on-chip clock signals received from clock circuitry 22 of FIG. 2). The modified clock signal may be provided from interpolator circuitry 32 to interface circuits 34 via path 38. Control signals received from interface circuits 34 may be used in generating the modified clock signal. For example, interface circuits 34 may produce control signals in a feedback loop based on the modified clock signal and signals received at I/O pins 14. As another example, interface circuits 34 may produce the control signals based on calibration data obtained during calibration operations (e.g., calibration operations performed at or subsequent to device start-up).

Selection circuitry 36 may receive the control signals produced by interface circuits 34 and provide a selected one of the control signals to shared interpolator circuitry 32. Selection circuitry 36 may include multiplexing circuits or other selection circuits that are configured (programmed) to route the selected control signals from the corresponding interface circuit 34 to shared interpolator circuitry 32. Selection circuitry may be configured by loading control values into one or more programmable elements 20. As an example, selection circuitry may be configured (programmed) via programmable element 20 to route control signal S1 to shared interpolator circuitry 32.

The example of FIG. 3 in which selection circuitry 36 selects a control signal from interface circuits IF1 and IF2 is merely illustrative. If desired, I/O circuit 12 may include any desired number of interface circuits 34 that produces control signals. Selection circuitry 36 may receive some or all of the control signals and provide a selected control signal to shared interpolator circuitry 32.

Figure 4:
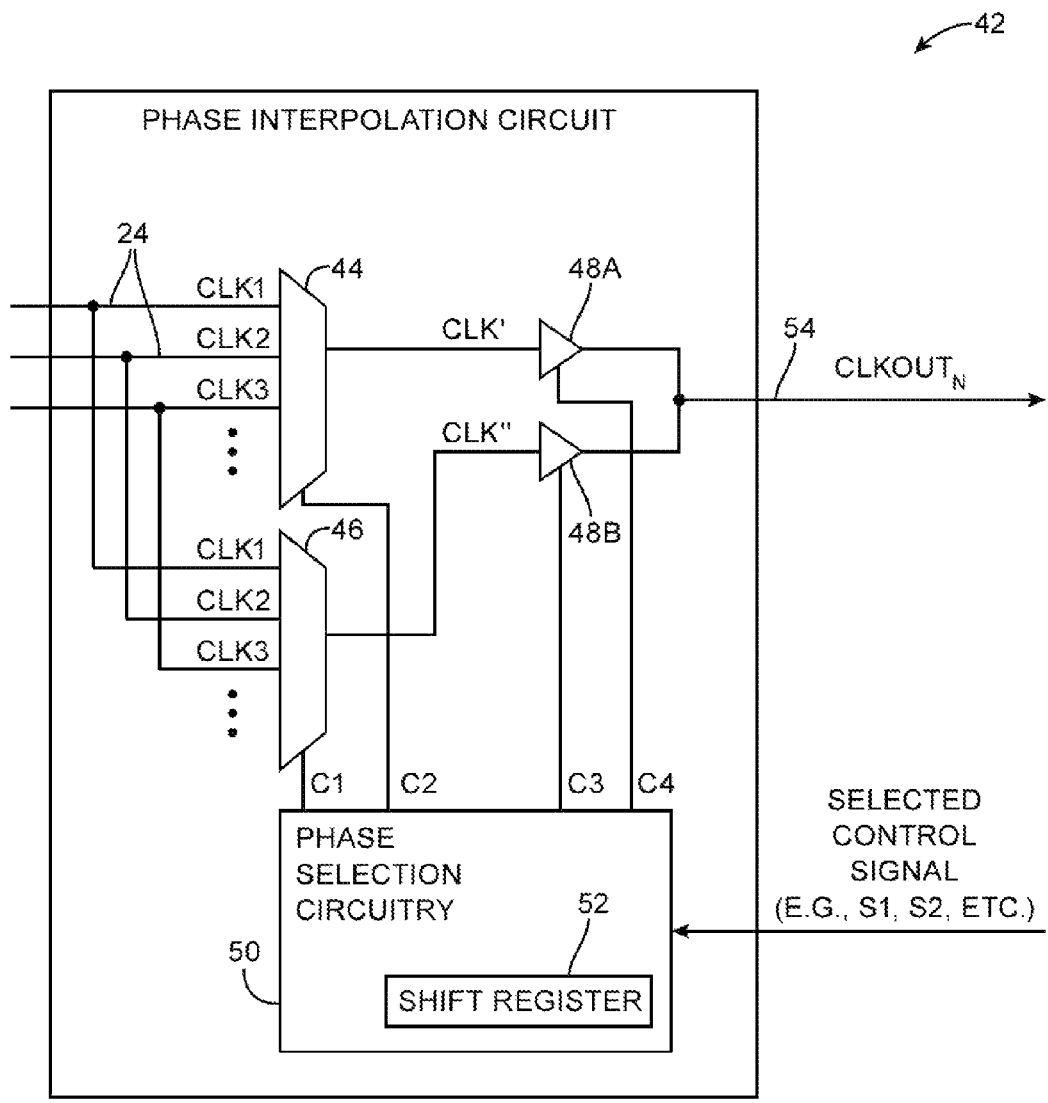
FIG. 4 is a diagram of an illustrative phase interpolation circuit that may be included in interpolation circuitry in accordance with an embodiment of the present invention.

FIG. 4 is an illustrative diagram of an interpolation circuit 42 that may be included in shared interpolator circuitry 32 of FIG. 3. Interpolation circuit may receive clock signals CLK1, CLK2, CLK3, etc. via clock paths 24 (e.g., from clock circuitry 22 of FIG. 2). Control signals such as a selected control signal from selection circuitry 36 may be received at phase selection circuitry 50.

Multiplexers 44 and 46 may select a pair of clock signals CLK' and CLK" from the input clock signals based on control signals C1 and C2. Clock signal CLK' may be provided to signal driver 48A, whereas clock signal CLK" may be provided to signal driver 48B. Signal drivers 48A and 48B may be adjustable-strength signal drivers that drive output path 54 with an adjustable strength based on control signals C3 and C4 that are provided by phase selection circuitry 50. Clock signal CLKOUTN may be formed from the combined outputs of signal drivers 48A and 48B and may have a phase that is between the phase of clock signals CLK' and CLK".

Phase selection circuitry 50 may receive a phase selection signal (e.g., a control signal such as signals S1, S2, etc.) and generate control signals C1, C2, C3, and C4 for multiplexers 44 and 46 and drivers 48A and 48B that control the multiplexers and drivers to produce clock signal CLKOUTN with a desired phase. Multiplexers 44 and 46 may be controlled to select a pair of input clock signals having phases that approximate the desired phase, whereas the drive strength of drivers 48A and 48B may be adjusted to tune the phase of output clock signal CLKOUTN to have the desired phase.

Phase selection circuitry 50 may include storage such as shift register 52 or other storage (e.g., flip-flops, registers, etc.) having values that are updated by the selected control signal (e.g., from selection circuitry 36 of FIG. 3). The value stored in shift register 52 may be shifted up or down based on the selected control signal or an entirely new value may be stored from the selected control signal. In these scenarios, phase selection circuitry 50 may produce control signals C1, C2, C3, and C4 based on the stored value in shift register 52.

Figure 5:
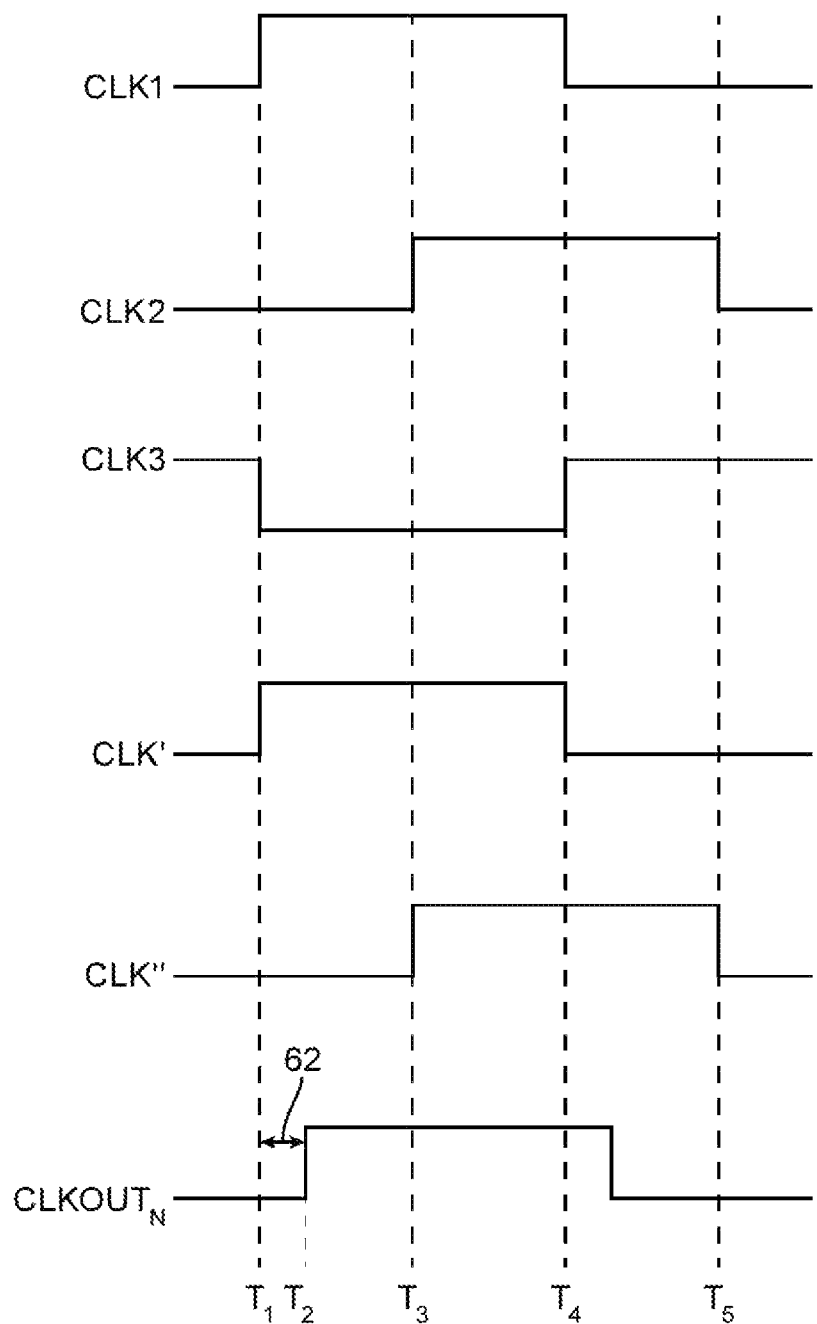
FIG. 5 is an illustrative timing diagram showing how phase interpolation circuitry may generate modified-phase clock signals from input clock signals in accordance with an embodiment of the present invention.

FIG. 5 is an illustrative timing diagram showing how phase interpolation circuit 42 may generate an output clock signal CLKOUTN that is modified from input clock signals CLK1, CLK2, and CLK3. In the example of FIG. 5, the input clock signals may have the same clock frequency, but are offset from each other in phase by a predetermined amount. The phase of clock signal CLK2 may be shifted from the phase of clock signal CLK1 so that the rising edge of clock signal CLK2 occurs at time T3 that is subsequent to time T1, which corresponds to the rising edge of clock signal CLK1. Similarly, the phase of clock signal CLK3 may be offset from the phase of clock signal CLK2.

Phase interpolation circuit 42 may identify that the desired phase of output clock signal CLKOUTN lies between clock signals CLK1 and CLK2. The desired phase may, for example, be determined based on a control signal received by phase selection circuitry 50 (e.g., a control signal selected from signals S1 and S2 by selection circuitry 36 of FIG. 3). Phase selection circuitry 50 may subsequently provide multiplexer control signals C1 and C2 to multiplexers 44 and 46 that select clock signals CLK1 and CLK2. Multiplexer 44 may select clock signal CLK1 as multiplexer output signal CLK', whereas multiplexer 46 may select clock signal CLK2 as multiplexer output signal CLK". Adjustable driver circuits 48A and 48B may receive the selected clock signals CLK1 and CLK2, respectively.

Phase selection circuitry may control the drive strength of adjustable driver circuits 48A and 48B to produce output clock signal CLKOUTN having the desired phase between clock signals CLK1 and CLK2. To set the phase of output clock signal CLKOUTN more closely to the phase of CLK', the drive strength of driver 48A may be increased and/or the drive strength of driver 48B may be decreased. Similarly, to set the phase of output clock signal CLKOUTN to more closely match the phase of CLK", the drive strength of driver 48A may be decreased and/or the drive strength of driver 48B may be increased.

In the example of FIG. 5, the desired phase of output clock signal CLKOUTN may more closely match the phase of clock signal CLK1 than clock signal CLK2. Phase selection circuitry 50 may provide control signals C3 and C4 that adjust the drive strengths of drivers 48A and 48B so that the drive strength of driver 48A is greater than driver 48B. For example, the drive strength of driver 48A may be increased. As another example, the drive strength of driver 48B may be reduced. As yet another example, the drive strength of driver 48A may be increased while the drive strength of driver 48B is simultaneously reduced.

Drivers 48A and 48B may drive output path 54 with opposing values when clock signals CLK' and CLK" have opposing values. For example, between times T1 and T3, clock signal CLK' may be logic one, whereas clock signal CLK" may be logic zero. During this time period, the zero-to-one transition (rising edge) of output clock signal CLKOUTN at time T2 may be delayed by time delay 62 relative to the rising edge of clock signal CLK' at time T1, because driver 48B opposes the logic one transition of output clock signal CLKOUTN.

As the drive strength of driver 48A is increased relative to the drive strength of driver 48B, time delay 62 may be reduced. In other words, as the difference of drive strength from driver 48A to driver 48B is increased, rising edge time T2 of output clock signal CLKOUTN may approach rising edge time T1 of clock signal CLK'. Similarly, as the drive strength of driver 48B is increased relative to the drive strength of driver 48A, time delay 62 may increase so that the rising edge of output clock signal CLKOUTN approaches the rising edge of clock signal CLK".

Figure 6:
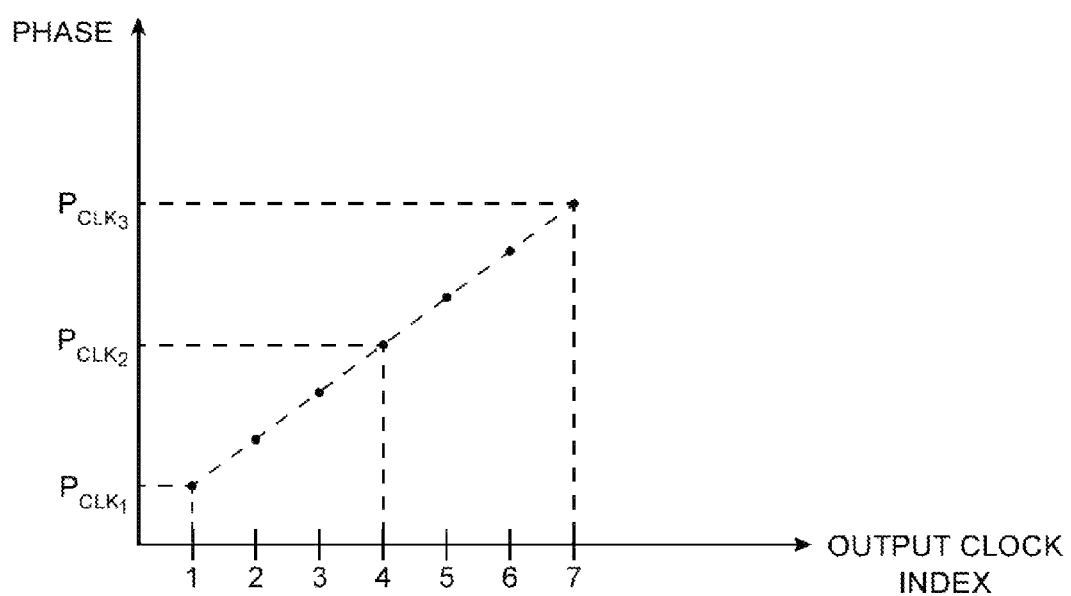
FIG. 6 is an illustrative diagram showing how phase interpolation circuitry may generate modified-phase clock signals indexed by phase in accordance with an embodiment of the present invention.

The accuracy of phase interpolation circuit 42 may be determined by the number of input clock signals and the degree to which the drive strengths of driver circuits 48A and 48B are adjustable. As the number of input clock signals having different phase characteristics increases, the initial phase selection via multiplexers 44 may more accurately match a desired output clock phase. As the number of available drive strength values of driver circuits 48A and 48B increases, phase selection circuitry 50 may provide increased accuracy in adjusting the output clock phase between the phases of the clock signals selected by multiplexers 44 and 46. Phase interpolation circuitry 42 may provide a discrete number of possible phase values bounded by the phases of the input clock signals. FIG. 6 is an illustrative graph showing how phase interpolation operations performed by a phase interpolation circuit may produce output clock signals having different phase characteristics.

In the example of FIG. 6, output clock signal CLKOUTN may be produced having seven discrete phase values that are indexed from one to seven (e.g., output clock signals CLKOUT1, CLKOUT2, CLKOUT3, . . . , and CLKOUT7). At output clock index one, the output clock signal may be produced having phase PCLK1 of input clock CLK1. Similarly, output clock indices four and seven may correspond to the phases of input clock signals CLK2 and CLK3, respectively. At intermediate indices such as indices two, three, five and six, the output clock signal may be produced having phases between the phases of the input clock signals. For example, phases between input clock signals CLK1 and CLK2 may be produced for indices two and three, whereas intermediate phases between PCLK2 and PCLK3 may be produced for indices five and six.

Each indexed output clock signal may be produced using a different combination of control signals (e.g., by adjusting control signals C1, C2, C3, and C4). The input control signal received by phase interpolation circuit from interface circuits may be used to select an index for clock signal output. For example, an interface circuit may select output clock index four to direct phase interpolation circuit 42 to produce output clock signal CLKOUT4 having phase PCLK2 of input clock signal CLK2. As another example, an interface circuit may select output clock index two so that interpolation circuit 42 produces output clock signal CLKOUT2 having a phase between PCLK1 and PCLK2.

Figure 7:
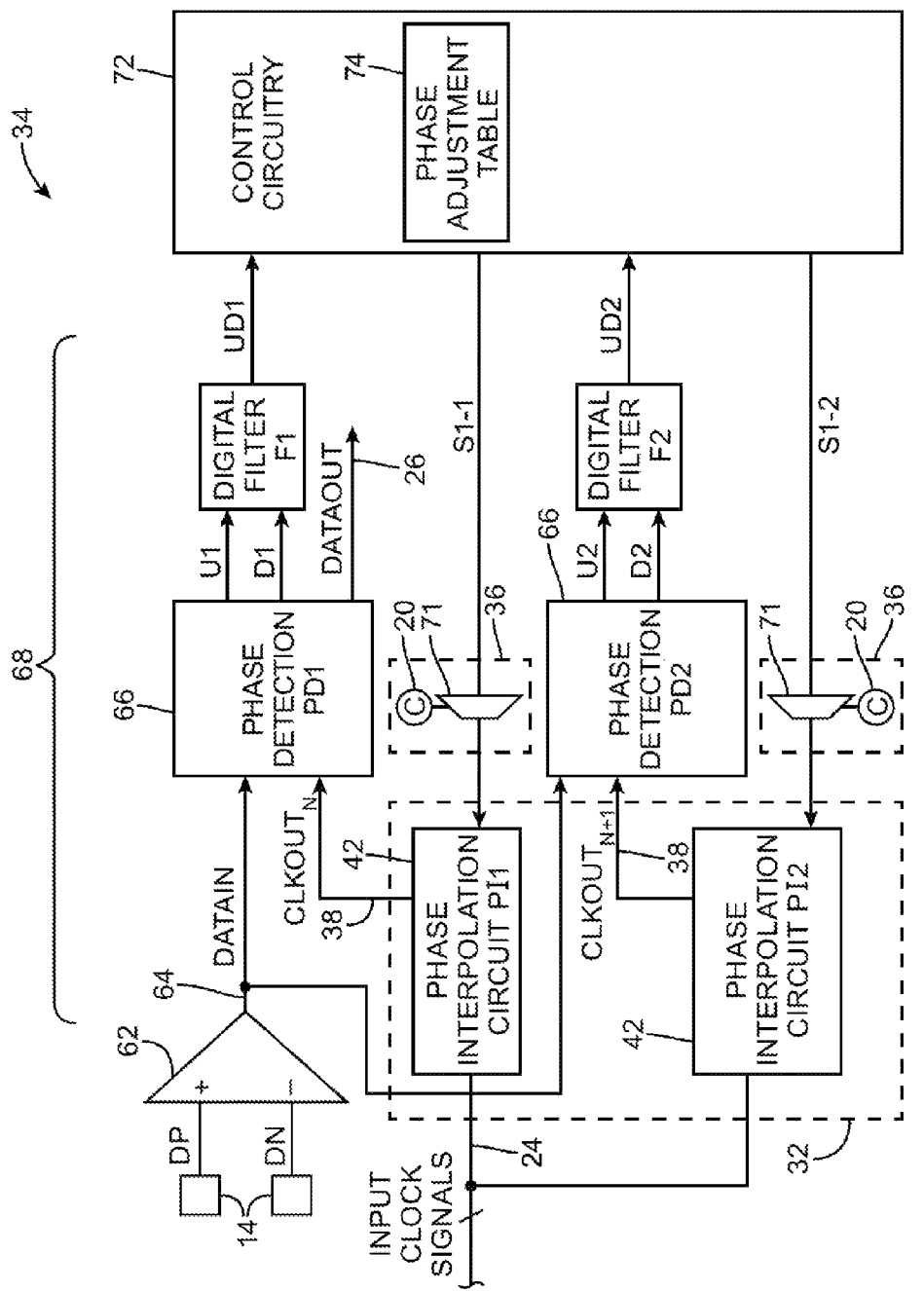
FIG. 7 is a diagram of an illustrative clock recovery interface circuit that may use shared interpolator circuitry in accordance with an embodiment of the present invention.

Phase interpolation circuitry such as phase interpolation circuits 42 may be used in high-speed communications such as gigabit Ethernet or other off-chip communications to recover clock signals from received data signals. Interface circuits that serve to recover clock signals from data signals that have been externally generated may sometimes be referred to as clock and data recovery (CDR) interface circuits or clock recovery interface circuits. FIG. 7 is an illustrative diagram of a clock and data recovery interface circuit 34 that may use phase interpolation circuitry 42 for clock recovery operations.

As shown in FIG. 7, clock recovery interface circuit 34 may receive input data signals DP and DN via pins 14. Input data signals DP and DN may form a combined differential signal that is received by a differential amplifier 62. Differential amplifier 62 may produce data signal DATAIN on path 64 from the difference between input signals DP and DN. Phase detection circuit PD1 may receive data signal DATAIN from differential amplifier 62 and clock signal CLKOUTN from phase interpolation circuit PI1. Phase detection circuit PD1 may produce data output signal DATAOUT by clocking the DATAIN signal with clock signal CLKOUTN. Clock signal CLKOUTN may also be provided at an output of clock recovery interface circuit 34. Clock recovery interface circuit 34 of FIG. 7 may, for example, be used to implement a differential signaling standard such as low-voltage differential signaling (LVDS) for high-speed communications such as gigabit Ethernet.

Phase detection circuit PD1 may monitor signals DATAIN and CLKOUTN to determine whether the currently received CLKOUTN signal matches the phase of the DATAIN signal. In response to determining that the phase of the CLKOUTN signal should be increased, phase detection circuit PD1 may assert control signal U1 (e.g., an "up" control signal) to indicate that the phase of clock signal CLKOUTN should be increased. In response to determining that the CLKOUTN signal should be decreased, phase detection circuit PD1 may assert control signal D1 (e.g., a "down" control signal) to indicate that the phase of clock signal CLKOUTN should be decreased.

The example of FIG. 7 in which up and down control signals U1 and D1 are produced by phase detection circuit PD1 separately is merely illustrative. If desired, up and down control signals U1 and D1 may combined as a single control signal that indicates whether the phase of clock signal CLKOUTN should be increased or decreased to match input data signal DATAIN.

Phase detection circuit PD1 may be susceptible to noise such as jitter and other sources of noise in data signal DATAIN and clock signal CLKOUTN. For example, jitter in data signal DATAIN can result in fluctuations and inaccuracies in phase detection operations. Such inaccuracies can result in errors in control signals U1 and D1 that are produced by phase detection circuit PD1. To help minimize inaccuracies due to noise, digital filter F1 may receive up and down control signals U1 and D1 and remove high-frequency noise to produce control signal UD1. Digital filter F1 may, for example, perform averaging operations to remove high-frequency fluctuations in the up and down signals. Digital filter F1 may have an associated cutoff frequency beyond which noise in the up and down signals is removed. The cutoff frequency may be selected based on a protocol specification that is used to generate the data signal.

Phase interpolation circuit PI1, phase detection circuit PD1, and digital filter F1 may form a first clock recovery branch 68 that determines whether data signal DATAIN matches the phase of clock signal CLKOUTN. Interface circuit 34 may include a second clock recovery branch 70 that matches data signal DATAIN with a second clock signal CLKOUTN+1. The index of clock signal CLKOUTN+1 may be incremented from the index of clock signal CLKOUTN by one so that the phases of both clock signals are offset from each other (see, e.g., FIG. 6).

Clock recovery branch 70 may include phase interpolation circuit PI2, phase detection circuit PD2, and digital filter F2 that operate similarly to the circuitry of clock recovery branch 68. However, clock signal CLKOUTN+1 produced by phase interpolation circuit PI2 may be offset from clock signal CLKOUTN. Clock signals CLKOUTN and CLKOUTN+1 may be offset using control signals S1-1 and S1-2 produced by control circuitry 72 or may be offset via implementation of phase interpolation circuits PI1 and PI2 (e.g., phase interpolation circuit PI2 may be designed to produce output clock signal CLKOUTN+1 having an index that is incrementally greater than output clock signal CLKOUTN produced by phase interpolation circuit PI1 when provided with the same input control signal).

Control circuitry 72 may receive up-down control signals UD1 and UD2 from clock recovery branches 68 and 70 and produce control signals S1-1 and S1-2 based on the up-down control signals. Control signals S1-1 and S1-2 may be conveyed to phase interpolation circuits PI1 and PI2 by selection circuitry 36 during clock recovery configurations. For example, multiplexers 71 may be configured via programmable elements 20 to route signals S1-1 and S1-2 to phase interpolation circuits PI1 and PI2.

Figure 8:
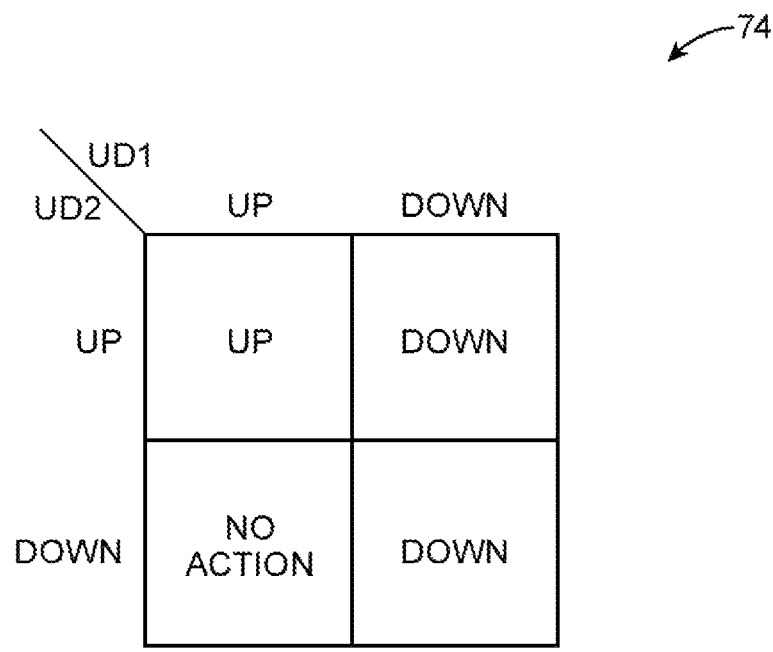
FIG. 8 is an illustrative table that may be maintained by a clock recovery interface circuit to determine phase adjustments for shared interpolator circuitry in accordance with an embodiment of the present invention.

Control circuitry 72 may maintain a phase adjustment table 74 that identifies appropriate values for control signals S1-1 and S1-2 based on up-down control signals UD1 and UD2 received from clock recovery branches 68 and 70. FIG. 8 is an illustrative diagram of a phase adjustment table 74 that may be maintained by control circuitry 72.

As shown in FIG. 8, phase adjustment table 74 may identify actions to be performed based on up/down signals UD1 and UD2. If signals UD1 and UD2 indicate that the phase of clock signals CLKOUTN and CLKOUTN+1 should both be increased (UP), control circuitry 72 may provide control signals S1-1 and S1-2 to phase interpolation circuit PI1 and PI2 that direct the phase interpolation circuits to increase the phase offsets for both clock signals (e.g., increase the index of both clock signals by one). Similarly, if signals UD1 and UD2 indicate that the phases of clock signals CLKOUTN and CLKOUTN+1 should be decreased (DOWN), control circuitry 72 may direct the phase interpolation circuits to decrease the phase offsets of clock signals CLKOUTN and CLKOUTN+1 (e.g., decrease the index of both clock signals by one).

If control signals UD1 and UD2 have conflicting values that converge, phase adjustment table 74 may indicate that no action should be taken, because clock signal CLKOUTN has been adjusted to match data signal DATAIN within the capabilities of phase interpolation circuits PI1 and PI2. For example, the desired clock phase may be between the phases of output clock signals CLKOUTN and CLKOUTN+1 when control signal UD1 indicates UP and control signal UD2 indicates DOWN, because the phase of control signal UD1 may be smaller than the phase of control signal UD2.

If control signals UD1 and UD2 have conflicting values that diverge, phase adjustment table 74 may indicate that the phases of clock signals CLKOUTN and CLKOUTN+1 should be increased (UP) or decreased (DOWN), as long as the table consistently indicates either UP or DOWN. In the example of FIG. 8, control signal UD1 may take precedence (e.g., table 74 may indicate that clock phase offsets should be decreased to correspond to control signal UD1). Whether or not the control signals UD1 and UD2 diverge may depend on the relative phase positioning (e.g., index) between clock signals CLKOUTN and CLKOUTN+1. For example, in the scenario that the phase of clock signal CLKOUTN is less than the phase of clock signal CLKOUTN+1, control signals UD1 and UD2 may diverge when UD1 indicates DOWN and UD2 indicates UP. As another example, if the phase of CLKOUTN is greater than the phase of CLKOUTN+1, control signals UD1 and UD2 may diverge when UD1 indicates UP and UD2 indicates DOWN.

Figure 9:
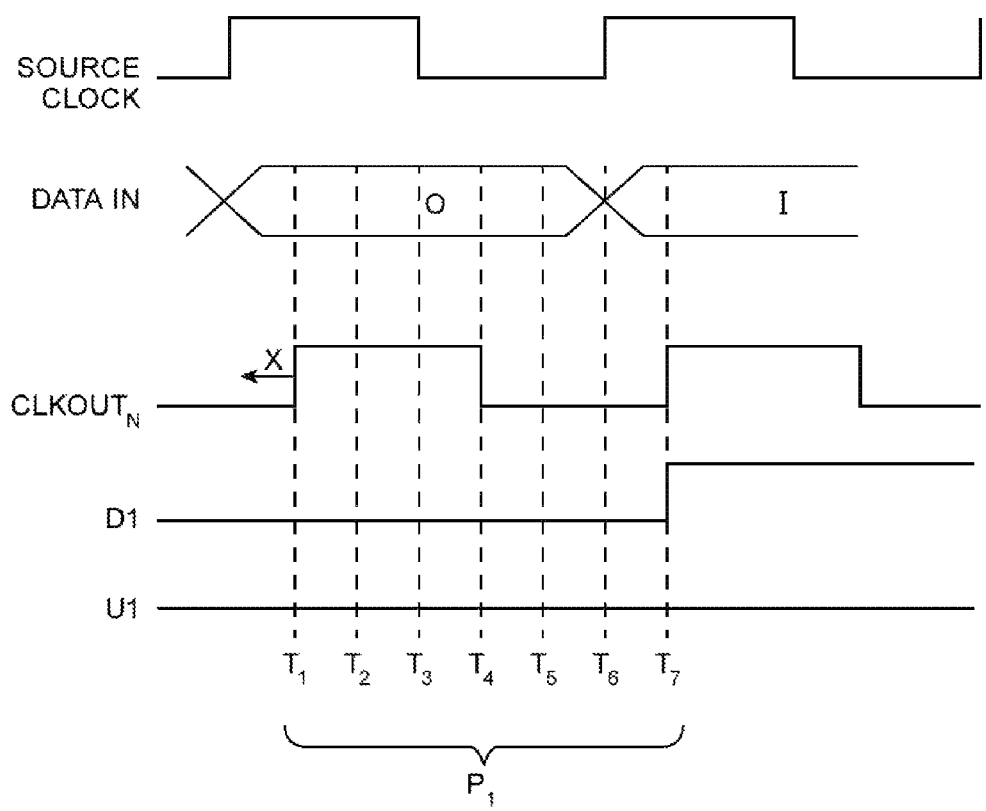
FIG. 9 is an illustrative timing diagram showing how a phase detection circuit may be used to determine phase adjustments to a clock signal based on an input data signal in accordance with an embodiment of the present invention.

FIG. 9 is an illustrative timing diagram showing how phase detection circuits 66 of FIG. 7 may perform phase detection operations. The example of FIG. 9 may be described in reference to phase detection circuit PD1. However, phase detection operations may be performed similarly by phase detection circuit PD2.

As shown in FIG. 9, input data signal DATAIN may be externally generated based on a source clock signal (e.g., an external clock signal that is not received by the input-output circuit). Changes to data signal DATAIN occur at the rising edge of the source clock signal. Clock recovery operations may be performed so as to match clock signal CLKOUTN with the source clock signal based on the DATAIN signal.

At the rising edge of clock signal CLKOUTN (time T1), phase detection circuit PD1 may sample the DATAIN signal. At predetermined intervals spanning one clock period P1 of clock signal CLKOUTN subsequent to the rising edge of clock signal CLKOUTN, phase detection circuit PD1 may obtain additional samples of the DATAIN signal (e.g., at times T2, T3, T4, T5, T6, and T7). The example of FIG. 9 in which seven samples are taken is merely illustrative. Any desired number of additional samples may be taken at predetermined intervals spanning one clock period P1 (e.g., at least three samples).

Phase detection circuit PD1 may subsequently determine whether the sampled values are consistent with each other. In the scenario of FIG. 9, phase detection circuit PD1 may determine that samples at T6 and T7 have logic one values that are different from the logic zero values of samples at T1-T5. Circuit PD1 may identify that the transition between logic zero to logic one occurs in the latter half of the sampled values and may therefore assert down signal D1 to shift the phase of clock signal CLKOUTN along direction X. In other words, the index of the output clock signal may be reduced to produce CLKOUTN−1 that more closely matches the source clock. If desired, the index of the output clock signal may be adjusted in a modulo-type operation (e.g., index zero may be modulo reduced to index 7, whereas index 7 may be modulo increased to index zero).

Figure 10:
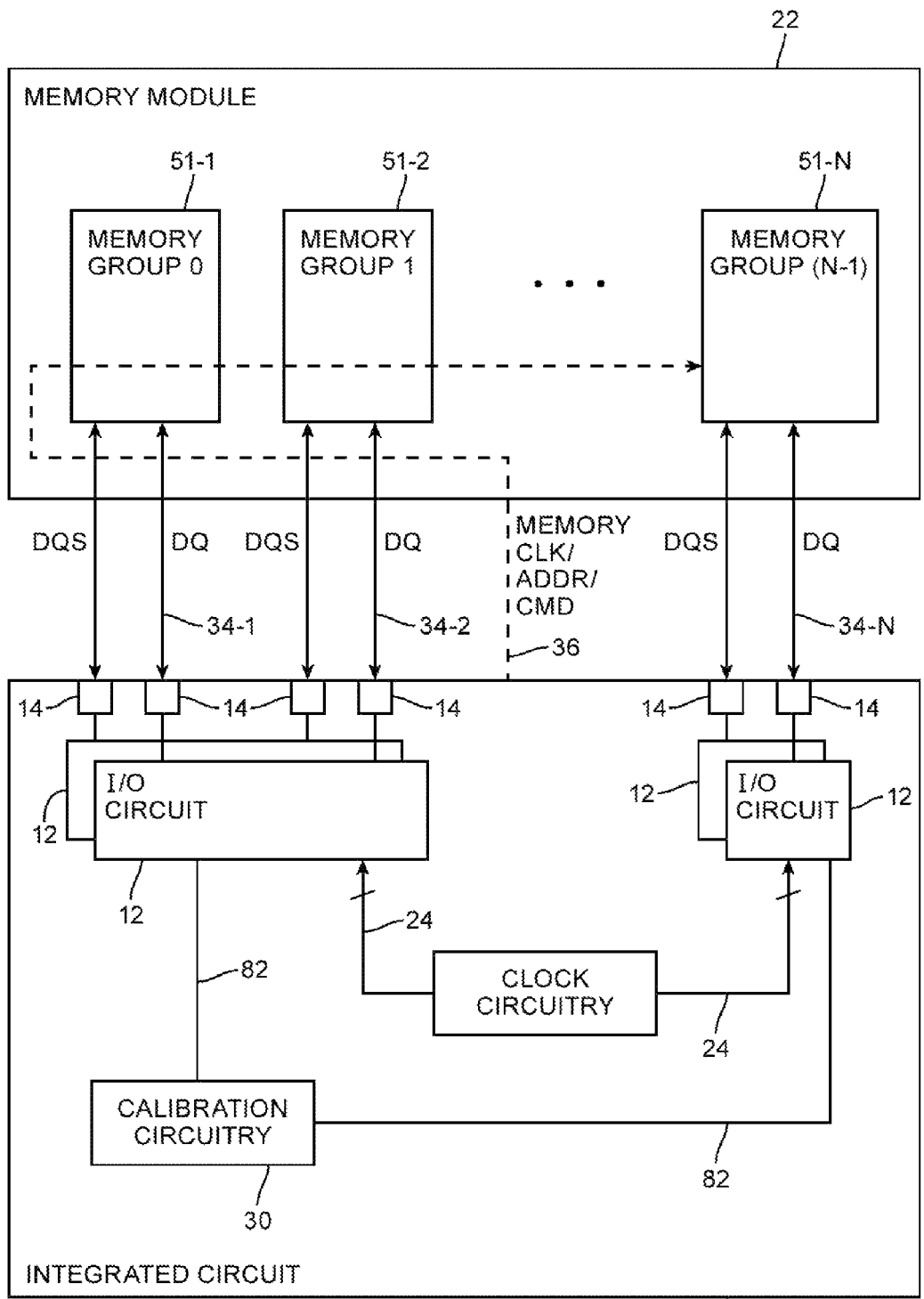
FIG. 10 is a diagram of an illustrative system including an integrated circuit that communicates with external memory using input/output circuits in accordance with an embodiment of the present invention.

Interpolator circuitry having phase interpolation circuits may be shared between different high-speed communications interface circuits of an input-output circuit. The phase interpolation circuits may be used to implement different functions based on the type of communications that the input-output circuit has been configured to perform. FIG. 10 is an illustrative diagram showing a scenario in which input-output circuits 12 of device 10 are configured to communicate with memory module 22.

Memory module 22 may be a memory device sometimes referred to as a single in-line memory module (SIMM) or a dual in-line memory module (DIMM). Device 10 may be configured to communicate with at least one memory module 22, at least two memory modules 22, at least four memory modules 22, etc. Input/output circuits 12 may be coupled to memory module 22 through paths 34 and I/O pins 14. During memory read operations, data (DQ) signals may be conveyed from memory module 22 to I/O circuits 12 over path 34. During memory write operations, data signals may be conveyed from I/O circuits 12 to memory module 22 over path 34. Data strobe signals DQS may be conveyed between memory module 22 and integrated circuit 10 that indicate when data on paths 34 are valid. Calibration circuitry 30 may be used upon startup to perform calibration operations (e.g., for reducing skew caused by process variations).

During read and write operations, control signals such as clock CLK and other control signals such as address ADDR and command CMD signals may be conveyed from integrated circuit 10 to memory module 22 over path 36. Signal CLK may serve as a system reference clock (e.g., a reference clock to which the address signal ADDR and command signal CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

Memory module 22 may include a series of memory devices, each of which is sometimes referred to as a memory group. For example, memory module 22 may include first memory group 51-1, second memory group 51-2, ..., and $N^{th}$ memory group 51-N. Memory module 22 may include eight memory groups (as an example). Each of the memory groups may contain hundreds or thousands of memory cells (e.g., RAM cells). The memory groups may communicate with integrated circuit 10 through respective signal paths. For example, first memory group 51-1 may communicate with a first I/O circuit 12 by sending data over path 34-1, second memory group 51-2 may communicate with the first I/O circuit 12 by sending data over path 34-2, Nth memory group 51-N may communicate with a second I/O circuit 12 over path 34-N, etc.

In general, memory access operations are not synchronized with system-level control signals CLK/CMD/ADDR. As a result, the DQ signals that are received from memory module 22 are not phase aligned with any known clock signal in device 10. It is therefore necessary to provide data strobe (DQS) signals with the DQ signals, so that the DQS strobes can be used to establish proper timing relationships when processing the DQ signals. For example, during a read operation, integrated circuit 10 uses the DQS signals in capturing data as it is transmitted over paths 34 from memory 22.

The operation of each memory group is somewhat independent, so memory module 22 generates a separate DQS signal for each of the memory groups. Integrated circuit 10 may send control signals to the memory groups via path 36. Memory module 22 of FIG. 10 may be a type of memory module in which the control signals on path 36 arrive at each of the memory groups at different times. For example, because of the way path 36 is routed, the control signals on path 36 may arrive first at memory group 51-1 and then arrive at each subsequent memory group after some delay.

During write operations, appropriate control signals may be sent over path 36 to direct the memory groups to store write data. Write data may be received at the memory groups at different times depending on when control signals CLK/CMD/ADDR arrive at a particular memory group. For example, memory group 51-1 may receive write data before subsequent memory group 51-2, memory group 51-2 may receive write data before subsequent memory group 51-3, memory group 51-3 may receive write data before subsequent memory group 51-4, etc. Process, voltage, and temperature (PVT) variations may also introduce skew between the DQ and DQS signals, resulting in degraded data sampling margins (i.e., reduced setup and hold times). Calibration circuitry 30 may be used to calibrate the phase of clock signals (e.g., clock signal CLK) used by I/O circuits 12 to produce memory interface signals such as DQ, DQS, ADDR, and CMD signals. For example, to accommodate staggered delay between memory groups, calibration circuitry 30 may calibrate phase characteristics of clock signals at I/O circuits 12. Calibration settings may be determined during calibration operations performed at device start up, may be determined dynamically during normal operation of integrated circuit 10, or may be pre-loaded into storage such as calibration registers prior to start up. Calibration circuitry may provide calibration values to I/O circuits 12 via paths 82.

Figure 11:
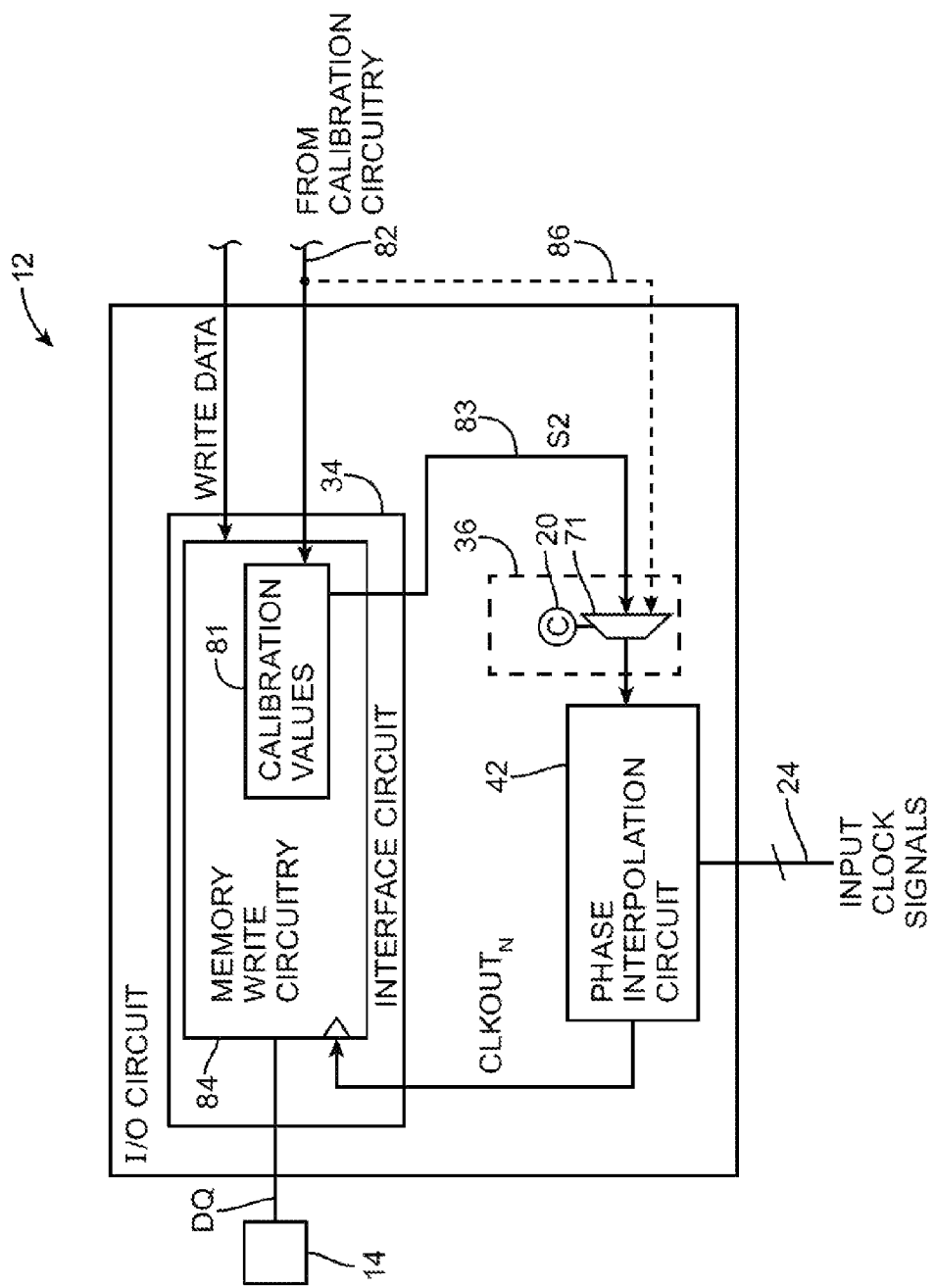
FIG. 11 is a diagram of an illustrative memory interface circuit that may use shared interpolator circuitry in accordance with an embodiment of the present invention.

FIG. 11 is a diagram of an I/O circuit 12 including a memory interface circuit 34. As shown in FIG. 11, I/O circuit 12 may include a memory interface circuit 34, at least one phase interpolation circuit 42, and selection circuitry 36. Memory interface circuit 34 may sometimes be referred to herein as an external memory interface (EMIF) circuit, because circuit 34 is used to interface with external (off-chip) memory such as memory module 22.

Memory interface circuit may include memory write circuitry 84 that receives write data (e.g., write data generated by integrated circuit 10 for writing into system memory). Write circuitry 84 may, for example, include buffers such as write buffers and first-in-first-out (FIFO) buffers that temporarily store data for write operations. If desired, memory interface circuit may include memory read circuitry (not shown) for receiving read data from system memory over I/O pin 14 (e.g., during read operations). The write data may be conveyed to I/O pin 14 as a DQ signal by memory write circuitry 84 based on clock signal CLKOUTN. For example, the DQ signal may be updated at the rising edge of clock signal CLKOUTN.

To help ensure that the DQ signal produced by memory write circuitry 84 has desired timing characteristics, phase interpolation circuit 42 may be controlled using calibration values received from calibration circuitry such as calibration circuitry 30 of FIG. 10. Phase interpolation circuit 42 may use the calibration values to produce clock signal CLKOUTN from input clock signals received on clock paths 24. The calibration values may, for example, identify a clock index having a desired phase (e.g., an output clock index of FIG. 6).

In the example of FIG. 11, phase interpolation circuit 42 includes a multiplexer 71 that may be configured via programmable element 20 to route calibration values 81 from memory write circuitry 84 to phase interpolation circuit 42 via path 83 (e.g., as control signal S2). However, if desired, the calibration values may be conveyed to phase interpolation circuit 42 via selection circuitry 36 and optional path 86, thereby bypassing memory write circuitry 84.

Figure 12:
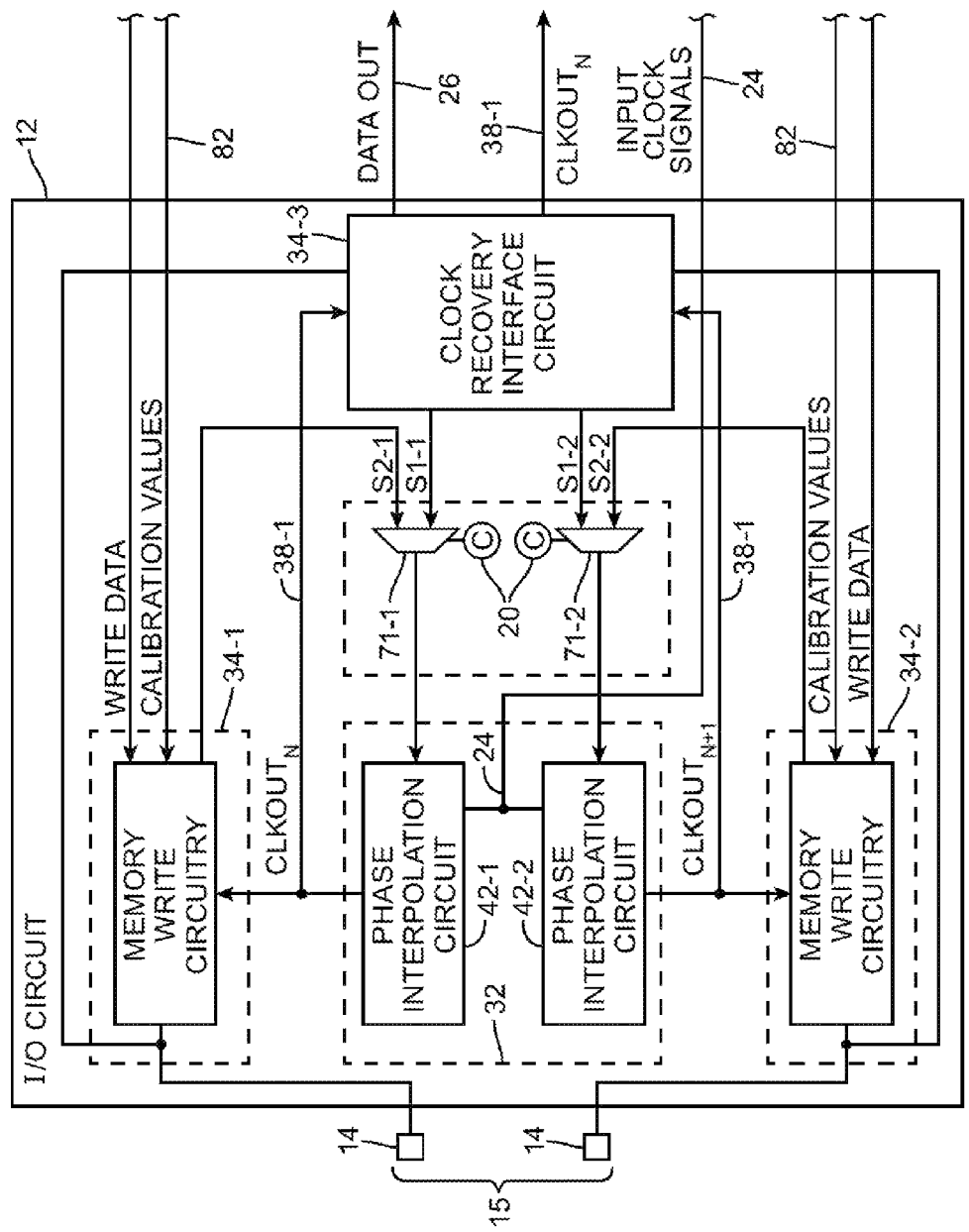
FIG. 12 is a diagram of an illustrative input/output circuit including memory interface circuits and clock recovery interface circuits that share interpolator circuitry in accordance with an embodiment of the present invention.

Multiple interface circuits such as memory interface circuit 34 of FIG. 11 and clock recovery interface circuit 34 of FIG. 7 may be implemented with shared interpolator circuitry. FIG. 12 is an illustrative diagram of I/O circuit 12 including multiple memory interface circuits 34-1 and 34-2 and a clock recovery interface circuit 34-3 that share interpolator circuitry 32. Memory interface circuits 34-1 and 34-2 may each operate similarly to memory interface circuit 34 of FIG. 11. For example, interface circuits 34-1 and 34-2 may each receive respective calibration values from calibration circuitry via paths 82 and provide write data at respective pins 14. Memory interface circuits 34-1 and 34-2 may produce respective control signals S2-1 and S2-2 for controlling interpolator circuitry 32. Clock recovery interface circuit 34-3 may operate similarly to clock recovery interface circuit 34 of FIG. 7. For example, clock recovery interface circuit 34-3 may provide control signals S1-1 and S1-2 to interpolator circuitry 32 during clock and data recovery operations and produce output signal DATAOUT based on input signals received at pins 14 and clock signals CLKOUTN and CLKOUTN+1 provided by interpolator circuitry 32. Clock signal CLKOUTN corresponding to output signal DATAOUT may be provided at an output of clock recovery interface circuit 34-3.

As shown in FIG. 12, I/O circuit 12 may be coupled to an associated set 15 of I/O pins 14. The set of I/O pins may be coupled to different types of external circuits based on a desired mode of operation. For example, I/O pins 14 may be coupled to a memory module 22 and convey memory signals such as DQ/DQS signals in an external memory interface mode (see, e.g., FIG. 10). As another example, I/O pins 14 may be coupled to external communications circuitry in a clock recovery interface mode (see, e.g., FIG. 7).

I/O circuit 12 may include selection circuitry 36 that can be configured or controlled based on the desired mode of operation. Programmable elements 20 may be loaded with configuration values that configure multiplexers 71-1 and 71-2 to route signals S1-1 and S1-2 to interpolator circuitry 36 during a clock recovery interface mode. During a memory interface mode, programmable elements 20 may be loaded with configuration values that configure multiplexers 71-1 and 71-2 to route signals S2-2 and S2-2 to phase interpolation circuits 42-1 and 42-2, respectively.

Figure 13:
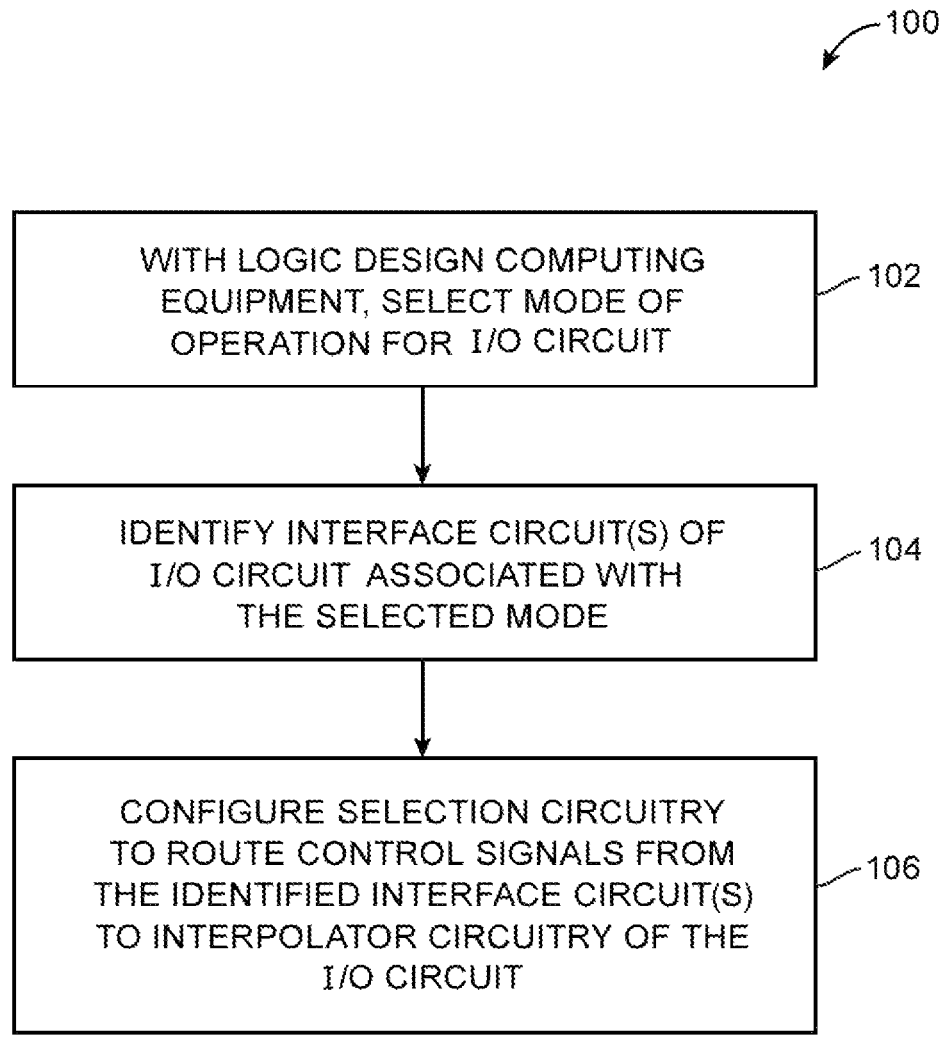
FIG. 13 is a flow chart of illustrative steps that may be performed to configure selection circuitry for sharing interpolator circuitry between multiple interface circuits of an input/output circuit in accordance with an embodiment of the present invention.

FIG. 13 is a flow chart 100 of illustrative steps that may be performed to configure a programmable integrated circuit with I/O circuitry having multiple interface circuits. The steps of flow chart 100 may be performed by logic design computing equipment (e.g., CAD tools implemented on computing equipment that is coupled to the programmable integrated circuit during programming operations) in configuring programmable elements such as programmable elements 20 in I/O circuits 12 of a programmable integrated circuit. In this scenario, control values may be stored in programmable elements 20 that configure the I/O circuits prior to normal operation of the programmable integrated circuit (e.g., during configuration operations). If desired, dynamic reconfiguration may be used to modify values stored in programmable elements during normal operation.

During step 102, the logic design computing equipment may select a mode of operation for an I/O circuit that accommodates multiple modes of operation. For example, the logic design computing equipment may select a clock recovery mode or a memory interface recovery mode for I/O circuit 12 of FIG. 12.

During step 104, the logic design computing equipment may identify one or more interface circuits of the I/O circuit that correspond to the selected mode of operation. In other words, the logic design computing equipment may determine which interface circuits of the I/O circuit should be activated to enable the selected mode of operation. For example, if a clock recovery mode is selected during step 102, clock recovery interface circuit 34-3 may be identified during step 104. As another example, if a memory interface mode is identified during step 102, memory interface circuits 34-1 and 34-2 may be identified during step 104.

During step 106, the logic design computing equipment may configure selection circuitry in the I/O circuit to route control signals from the identified interface circuits to interpolator circuitry that is shared between the interface circuits. For example, the logic design computing equipment may configure multiplexers 71-1 and 71-2 of FIG. 12 to route signals S2-1 and S2-2 from memory interface circuits 34-1 and 34-2 to interpolation circuitry 32. As another example, the logic design computing equipment may configure selection circuitry 36 to route signals S1-1 and S1-2 from clock recovery interface circuit 34-3 to interpolation circuitry 32.

By using the selection circuitry to route control signals from the identified interface circuits to the interpolator circuitry, the logic design computing equipment may effectively configure the mode of operation of the I/O circuit. The I/O circuit may therefore accommodate different communications standards, protocols, and/or technologies while conserving available die area due to use of shared interpolator circuitry.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   an input-output pin;
   a first interface circuit coupled to the input-output pin that communicates using a first communications protocol;
   a second interface circuit coupled to the input-output pin that communicates using a second communications protocol that is different than the first communications protocol; and
   interpolator circuitry that is shared between the first and second interface circuits, wherein the interpolator circuitry produces at least one modified clock signal from a plurality of clock signals.

2. The integrated circuit defined in claim 1 wherein each clock signal of the plurality of clock signals has a respective phase, wherein the interpolator circuitry comprises:
   at least one phase interpolation circuit that receives the plurality of clock signals and performs phase interpolation operations on the plurality of clock signals to produce the at least one modified clock signal.

3. The integrated circuit defined in claim 2 wherein the phase interpolation circuit comprises:
   a first multiplexer that receives the plurality of clock signals and produces a first selected clock signal from the plurality of clock signals; and
   a second multiplexer that receives the plurality of clock signals and produces a second selected clock signal from the plurality of clock signals, wherein the phase interpolation circuit produces the modified clock signal from the first and second selected clock signals.

4. The integrated circuit defined in claim 3 wherein the phase interpolation circuit further comprises:
   an output terminal at which the modified clock signal is provided;
   a first adjustable-strength driver circuit that receives the first selected clock signal and drives the output terminal with the first selected clock signal at a first drive strength; and
   a second adjustable-strength driver circuit that receives the second selected clock signal and drives the output terminal with the second selected clock signal at a second drive strength.

5. The integrated circuit defined in claim 4 wherein the first and second interface circuits produce respective first and second control signals, the integrated circuit further comprising selection circuitry that receives the first and second control signals and provides a selected control signal from the first and second control signals to the phase interpolation circuit.

6. The integrated circuit defined in claim 5 wherein the phase interpolation circuit further comprises:
   phase selection circuitry that receives the selected control signal and controls the first and second multiplexers and the first and second adjustable-strength driver circuits based on the selected control signal.

7. The integrated circuit defined in claim 2 wherein the first and second interface circuits produce respective first and second control signals, the integrated circuit further comprising:
   multiplexing circuitry that provides the first control signal to the interpolator circuitry in a first mode in which the first interface circuit is enabled and provides the second control signal to the interpolator circuitry in a second mode in which the second interface circuit is enabled.

8. The integrated circuit defined in claim 7 wherein the first interface circuit comprises a clock recovery interface circuit that recovers data in the first mode from signals received at the input-output pin using the at least one modified clock signal.

9. The integrated circuit defined in claim 8 wherein the second interface circuit comprises a memory interface circuit that performs memory access operations in the second mode over the input-output pin using the at least one modified clock signal.

10. The integrated circuit defined in claim 9 wherein the input-output pin comprises a first input-output pin, wherein the memory interface circuit comprises a first memory interface circuit, and wherein the integrated circuit further comprises:
    a second input-output pin that is coupled to the clock recovery interface circuit, wherein the clock recovery interface circuit recovers the data from the signals received at the first input-output pin and additional signals received at the second input-output pin; and
    a second memory interface circuit that performs memory access operations over the second input-output pin.

11. The integrated circuit defined in claim 10 wherein the at least one phase interpolation circuit comprises first and second phase interpolation circuits that produce respective first and second modified clock signals from the plurality of clock signals, wherein the first phase interpolation circuit is shared between the first memory interface circuit and the clock recovery interface circuit, and wherein the second phase interpolation circuit is shared between the second memory interface circuit and the clock recovery interface circuit.

12. The integrated circuit defined in claim 7 wherein the integrated circuit comprises a programmable integrated circuit.

13. An integrated circuit, comprising:
    clock circuitry that generates first and second clock signals having respective first and second phases;
    an input-output pin; and
    an input-output circuit coupled to the input-output pin, wherein the input-output circuit receives the first and second clock signals, wherein the input-output circuit performs clock recovery operations in a first mode and performs external memory interface operations in a second mode, and wherein the input-output circuit comprises:
      at least one phase interpolation circuit that produces a modified clock signal having a phase that is between the first and second phases.

14. The integrated circuit defined in claim 13 wherein the input-output circuit further comprises:
    clock recovery circuitry that performs the clock recovery operations on signals received from the input-output pin in the first mode; and
    memory interface circuitry that performs the external memory interface operations over the input-output pin in the second mode, wherein the at least one phase interpolation circuit is shared between the clock recovery circuitry and the memory interface circuitry.

15. The integrated circuit defined in claim 14 wherein the clock recovery circuitry produces a first clock control signal, wherein the memory interface circuitry produces a second clock control signal, and wherein the input-output circuit further comprises:
    selection circuitry that receives the first and second clock control signals and provides a selected clock control signal of the first and second clock control signals to the at least one phase interpolation circuit.

16. The integrated circuit defined in claim 15 further comprising:
    calibration circuitry that provides calibration values to the memory interface circuitry, wherein the memory interface circuitry produces the second clock control signal based on the calibration values.

17. A method of using logic design computing equipment to configure a programmable integrated circuit having an input-output pin, the method comprising:
    selecting a mode of operation for an input-output circuit that is coupled to the input-output pin, wherein the input-output circuit includes a plurality of interface circuits and phase interpolation circuitry shared between the plurality of interface circuits;
    identifying which interface circuits of the plurality of interface circuits are associated with the selected mode of operation; and
    configuring selection circuitry of the input-output circuit to convey control signals from the identified interface circuits to the phase interpolation circuitry.

18. The method defined in claim 17 wherein each interface circuit of the plurality of interface circuits produces a respective control signal, wherein the selection circuitry comprises multiplexing circuitry that receives the control signals of each of the plurality of interface circuits, and wherein configuring the selection circuitry of the input-output circuit to convey the control signals from the identified interface circuits to the phase interpolation circuitry comprises:
    configuring the multiplexing circuitry to select only the control signals from the identified interface circuits.

19. The method defined in claim 18 wherein the multiplexing circuitry is controlled by programmable elements that produce static output signals and wherein configuring the multiplexing circuitry comprises:

storing control values at the programmable elements.

20. The method defined in claim 17 wherein selecting the mode of operation for the input-output circuit comprises selecting between a memory interface mode and a clock recovery mode.

\* \* \* \* \*